US008828490B2

(12) United States Patent
Seo et al.

(10) Patent No.: US 8,828,490 B2
(45) Date of Patent: Sep. 9, 2014

(54) VAPOR DEPOSITION METHOD

(75) Inventors: Sang-Joon Seo, Yongin (KR);
Seung-Yong Song, Yongin (KR);
Seung-Hun Kim, Yongin (KR);
Jin-Kwang Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 103 days.

(21) Appl. No.: 13/352,191

(22) Filed: Jan. 17, 2012

(65) Prior Publication Data

US 2013/0017318 A1    Jan. 17, 2013

(30) Foreign Application Priority Data

Jul. 13, 2011   (KR) ........................ 10-2011-0069488

(51) Int. Cl.
*B05D 5/12*    (2006.01)
*C23C 16/00*   (2006.01)

(52) U.S. Cl.
USPC ...................... 427/248.1; 427/74; 427/255.28

(58) Field of Classification Search
USPC ................................... 427/248.1, 255.28, 74
See application file for complete search history.

(56) References Cited

U.S. PATENT DOCUMENTS

| 5,151,296 A * | 9/1992 | Tokunaga ..................... 438/488 |
| 6,634,314 B2 * | 10/2003 | Hwang et al. ............. 118/723 R |
| 6,820,570 B2 | 11/2004 | Kilpela et al. |
| 7,674,497 B2 | 3/2010 | Yamazaki et al. |
| 2006/0073276 A1 * | 4/2006 | Antonissen ................. 427/248.1 |
| 2007/0157879 A1 * | 7/2007 | Yotsuya ......................... 118/505 |
| 2008/0241384 A1 * | 10/2008 | Jeong et al. .............. 427/255.29 |
| 2009/0194409 A1 | 8/2009 | Utsunomiya et al. |
| 2010/0047450 A1 | 2/2010 | Li |
| 2010/0227060 A1 | 9/2010 | Na et al. |
| 2011/0281029 A1 * | 11/2011 | Honda et al. ............... 427/255.7 |

FOREIGN PATENT DOCUMENTS

| JP | 07-094417 | 4/1995 |
| JP | 10-041286 | 2/1998 |
| KR | 10-2004-0063893 | 7/2004 |
| KR | 10-2009-0007795 | 1/2009 |
| KR | 10-2010-0012115 A | 2/2010 |
| KR | 10-2010-0099917 | 9/2010 |
| KR | 10-2011-0039198 | 4/2011 |

OTHER PUBLICATIONS

KIPO Notice of Allowance dated Aug. 20, 2013, for Korean priority Patent application 10-2011-0069488, (2 pages).

* cited by examiner

*Primary Examiner* — Brian K Talbot
(74) *Attorney, Agent, or Firm* — Christie, Parker & Hale, LLP

(57) ABSTRACT

A vapor deposition apparatus, which is capable of performing a thin film deposition process and improving characteristics of a formed thin film, includes: a chamber having an exhaust opening; a stage disposed in the chamber, and comprising a mounting surface on which the substrate may be mounted; an injection unit having at least one injection opening for injecting a gas into the chamber in a direction parallel with a surface of the substrate, on which the thin film is to be formed; a guide member facing the substrate to provide a set or predetermined space between the substrate and the guide member; and a driving unit conveying the stage and the guide member.

6 Claims, 9 Drawing Sheets

VAPOR DEPOSITION METHOD

CROSS-REFERENCE TO RELATED PATENT APPLICATION

This application claims priority to and the benefit of Korean Patent Application No. 10-2011-0069488, filed on Jul. 13, 2011, in the Korean Intellectual Property Office, the disclosure of which is incorporated herein in its entirety by reference.

BACKGROUND

1. Field of the Invention

The present invention relates to a vapor deposition apparatus, a vapor deposition method, and a method of manufacturing an organic light emitting display apparatus.

2. Description of Related Art

Semiconductor devices, display apparatuses, and other electronic devices include a plurality of thin films. The plurality of thin films may be formed using various methods, one of which is a vapor deposition method.

According to the vapor deposition method, one or more gases are used as a source for forming thin films. The vapor deposition method may include a chemical vapor deposition (CVD) method, an atomic layer deposition (ALD) method, and various other methods.

Among display apparatuses, organic light emitting display apparatuses are considered to be next generation display apparatuses due to their wide viewing angles, excellent contrast, and fast response speeds.

Organic light emitting display apparatuses include an intermediate layer having an organic emission layer between a first electrode and a second electrode that face each other, and one or more thin films. Here, a deposition process may be used to form thin films of the organic light emitting display apparatus.

However, since the organic light emitting display apparatus increases in size and requires high resolution, it is difficult to form a large sized thin film having desired properties. In addition, there is a limitation in improving efficiency of processes for forming thin films.

SUMMARY

An aspect of an embodiment of the present invention is directed toward a vapor deposition apparatus capable of performing a deposition process efficiently and improving characteristics of thin films, a vapor deposition method, and a method of manufacturing an organic light emitting display apparatus.

According to an embodiment of the present invention, there is provided a vapor deposition apparatus for forming a thin film on a substrate, the apparatus including: a chamber having an exhaust opening; a stage disposed in the chamber, and comprising a mounting surface on which the substrate may be mounted; an injection unit having at least one injection opening for injecting a gas into the chamber in a direction parallel with a surface of the substrate, on which the thin film is to be formed; a guide member facing the substrate to provide a predetermined space between the substrate and the guide member; and a driving unit conveying the stage and the guide member.

The guide member may be disposed in parallel with the substrate.

The guide member may be equal to or greater in size than that of the substrate.

The guide member may have an irregular surface comprising a plurality of convex portions and a plurality of concave portions and facing the substrate.

The convex portions and the concave portions may be extended in a direction in which the gravity acts.

The space disposed between the guide member and the substrate may have a shape corresponding to the pattern of the thin film that is to be formed on the substrate, and the guide member may include a path to the space, and through which the gas injected from the injection unit passes.

The path may include at least a first penetration portion formed on an upper end of the guide member and a second penetration portion formed on a lower end of the guide member.

The first penetration portion or the second penetration portion may be elongated so as to correspond to the space.

The first penetration portion or the second penetration portion may include a plurality of penetration openings corresponding to the space.

The space may correspond in shape to a groove formed in a surface of the guide member, which faces the substrate.

The guide member may include a cover that covers the space.

The driving unit may convey the stage and the guide member in a direction perpendicular to the surface of the substrate, on which the thin film will be formed, in a state where the substrate is mounted on the stage.

The driving unit may move reciprocately.

The driving unit may convey the stage and the guide member simultaneously.

The driving unit may include a first driving unit that moves the stage and a second driving unit that moves the guide member.

The mounting surface may be disposed in parallel with the direction in which the gravity acts.

The injection unit may be disposed above the stage.

The exhaust opening may be connected to a pump.

A source gas and a reaction gas may be sequentially injected through the injection opening.

The injection unit may include a plurality of injection openings through which a source gas and a reaction gas are independently injected.

The exhaust opening may be closer to ground than the substrate is.

The apparatus may further include a mask having a mask opening for forming a thin film on the substrate in a desired pattern, wherein the mask is disposed on the substrate.

The injection unit may include a plurality of injection openings that are arranged in a direction perpendicular to the surface of the substrate on which the thin film will be formed, and are separated from each other so as to perform a deposition process for a plurality of times on the substrate.

According to another aspect of the present invention, there is provided a vapor deposition method for forming thin films on a substrate, the method including: mounting the substrate on a mounting surface of a stage that is disposed in a chamber; injecting a source gas toward a space between the substrate and a guide member that is in parallel with the substrate through an injection unit in a direction parallel with a surface of the substrate, on which thin films are to be formed; performing exhaustion through an exhaust opening of the chamber; injecting a reaction gas into the chamber through the injection unit in a direction parallel with the surface of the substrate; and performing an exhaustion through the exhaust opening of the chamber.

The exhaustion may be performed by a pump.

The injection unit may have an injection opening, and the source gas and the reaction gas may be sequentially injected through the injection opening.

The injection unit may have a plurality of injection openings, and the source gas and the reaction gas may be respectively injected through different ones of injection openings.

The mounting of the substrate may include placing a mask having an opening for forming the thin films of desired pattern on the substrate.

The thin film deposition may be performed while moving the substrate in a direction perpendicular to the surface of the substrate, on which the thin film is formed, in a state where the substrate is mounted on the stage in the chamber.

According to another aspect of the present invention, there is provided a method of manufacturing an organic light emitting display apparatus which may include a plurality of thin films including at least a first electrode, an intermediate layer including an organic emission layer, and a second electrode on a substrate, wherein the forming of the thin film includes: mounting the substrate on a mounting surface of a stage that is disposed in a chamber; injecting a source gas toward a space between a guide member facing the substrate and the substrate through an injection unit in a direction parallel with a surface of the substrate, on which the thin films are to be formed; performing exhaustion through an exhaust opening of the chamber; injecting a reaction gas into the chamber through the injection unit in a direction parallel with the surface of the substrate; and performing exhaustion through the exhaust opening of the chamber.

The forming of the thin film may include forming an encapsulation layer on the second electrode.

The forming of the thin film may include forming an insulating layer.

The forming of the thin film may include forming a conductive layer.

BRIEF DESCRIPTION OF THE DRAWINGS

The above and other features and aspects of the present invention will become more apparent by describing in detail exemplary embodiments thereof with reference to the attached drawings in which.

DETAILED DESCRIPTION

Hereinafter, embodiments of the present invention will now be described with reference to accompanying drawings.

Figure 1:
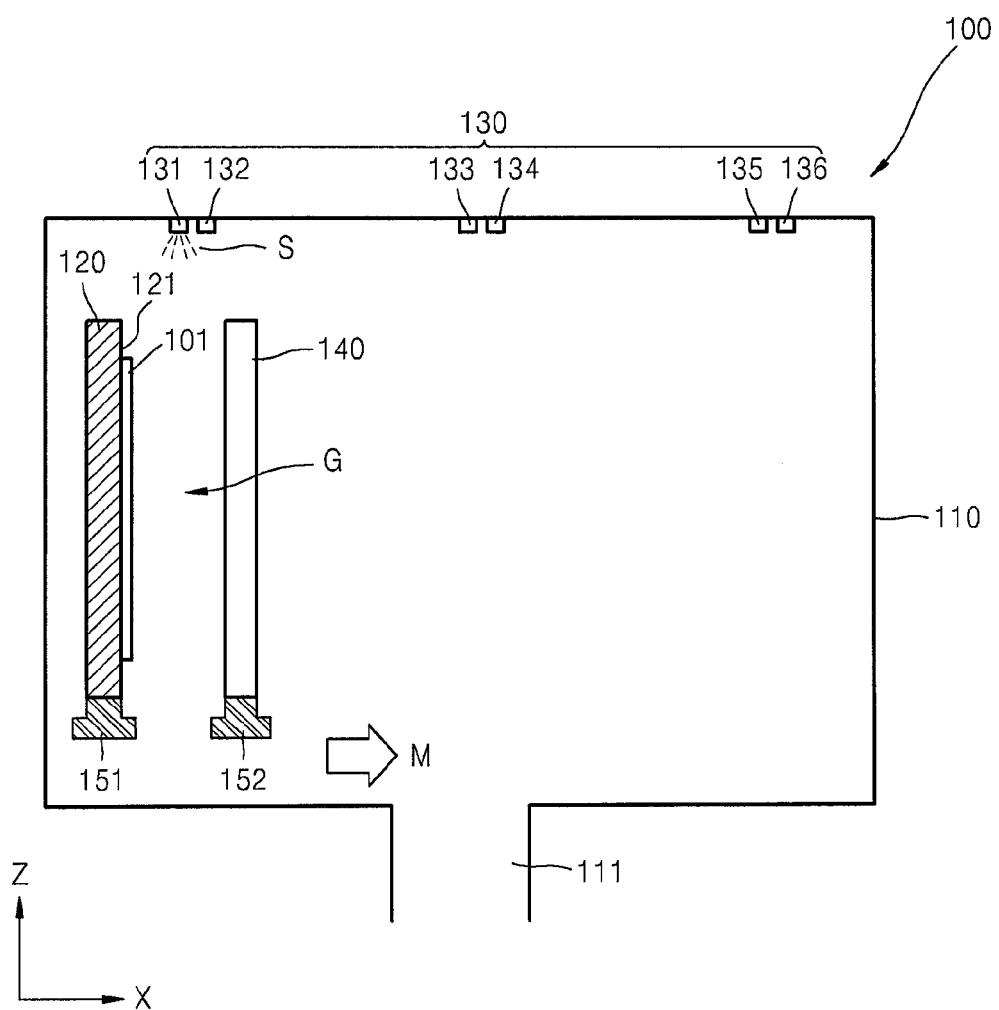
FIG. 1 is a schematic cross-sectional view of a vapor deposition apparatus according to an embodiment of the present invention.

FIG. 1 is a schematic cross-sectional view of a vapor deposition apparatus 100 according to an embodiment of the present invention.

Referring to FIG. 1, the vapor deposition apparatus 100 includes a chamber 110, a stage 120, an injection unit 130, a guide member 140, and first and second driving units 151 and 152.

The chamber 110 includes an exhaust opening (e.g., a hole) 111 on a lower portion thereof. The exhaust opening 111 is an outlet for exhausting gas, and may be connected to a pump so as to perform the exhaustion process easily.

Although not shown in FIG. 1, the chamber 110 is controlled by a pump so as to maintain a suitable pressure (e.g., a predetermined pressure). In addition, a heating unit (not shown) for heating inside of the chamber 110 may be disposed on an inner or outer portion of the chamber 110 so as to improve efficiency of a thin film deposition process.

The stage 120 is disposed in the chamber 110. The stage 120 includes a mounting surface 121. The mounting surface 121 is disposed in parallel with a direction in which gravity acts. That is, the mounting surface 121 is disposed perpendicularly to ground. To do this, the stage 120 is disposed perpendicularly to the ground.

A substrate 101 is disposed on the stage 120. In more detail, the substrate 101 is mounted on the mounting surface 121 of the stage 120.

A fixing unit (not shown) may be disposed on the mounting surface 121 so that the substrate 101 may be fixed after being mounted on the mounting surface 121. The fixing unit (not shown) may be a clamp, a compressing unit, an adhesive material, or other suitable materials or devices.

The guide member 140 is disposed to face the substrate 101. Thus, a space (e.g., a gap) G is formed between the substrate 101 and the guide member 140. The guide member 140 may be disposed in parallel with the substrate. In addition, the guide member 140 is formed as a flat plate having a size that is equal to or greater than that of the substrate 101.

The first and second driving units 151 and 152 are connected to the stage 120 and the guide member 140. In more detail, the first driving unit 151 is connected to the stage 120, and the second driving unit 152 is connected to the guide member 140. In FIG. 1, the first and second driving units 151 and 152 are separately formed from each other; however, the present invention is not limited thereto. That is, one driving unit that moves both the stage 120 and the guide member 140 concurrently or simultaneously may be used.

The first driving unit 151 conveys the stage 120 in a direction denoted by an arrow M shown in FIG. 1, or an opposite direction to the direction denoted by the arrow M. That is, the first driving unit 151 conveys the stage 120 in an X-axis direction of FIG. 1. Thus, the substrate 101 may be moved in a direction perpendicular to a surface of the substrate 101, that is, a surface on which a thin film will be formed.

In addition, the second driving unit 152 conveys the guide member 140 in the direction denoted by the arrow M shown in FIG. 1, or an opposite direction to the direction denoted by the arrow M. That is, the second driving unit 152 conveys the guide member 140 in an X-axis direction of FIG. 1. Thus, the guide member 140 may be moved in a direction perpendicular to a surface of the substrate 101, that is, a surface on which a thin film will be formed.

The first and second driving units 151 and 152 are controlled to maintain the space G between the substrate 101 and the guide member 140.

The injection unit 130 is connected to the chamber 110. One or more gases are injected toward the substrate 101 through the injection unit 130. In more detail, the injection unit 130 includes a first injection opening (e.g., a hole) 131, a second injection opening 132, a third injection opening 133, a fourth injection opening 134, a fifth injection opening 135, and a sixth injection opening 136.

In addition, the first through sixth injection openings 131 through 136 are arranged along a moving direction of the substrate 101. That is, the first through sixth injection openings 131 through 136 are arranged in the X-axis direction of FIG. 1 and separated from each other.

In addition, the first through sixth injection openings 131 through 136 may be formed to have various shapes, for example, may be formed as dots or lines corresponding to a width of the substrate 101.

A gas is injected into the chamber 110 through the first through sixth injection openings 131 through 136 in parallel with a surface direction of the substrate 101. That is, the gas is injected through the first through sixth injection openings 131 through 136 in parallel with a direction in which gravity acts.

In more detail, a source gas S is injected through the first, third, and fifth injection openings 131, 133, and 135, and a reaction gas is injected through the second, fourth, and sixth injection openings 132, 134, and 136.

While the source gas S is being injected through the first, third, and fifth injection openings 131, 133, and 135, the reaction gas is not injected through the second, fourth, and sixth injection openings 132, 134, and 136. After injecting the source gas S through the first, third, and fifth injection openings 131, 133, and 135, the reaction gas is injected through the second, fourth, and sixth injection openings 132, 134, and 136.

In addition, the source gas S may be sequentially, concurrently, or simultaneously injected through the first, third, and fifth injection openings 131, 133, and 135. Likewise, the reaction gas may be injected sequentially, concurrently, or simultaneously through the second, fourth, and sixth injection openings 132, 134, and 136.

However, the present invention is not limited to the above example. That is, the source gas S and the reaction gas may be injected through the same injection openings of the injection unit 130. For example, the injection unit 130 may include only the first, third, and fifth injection openings 131, 133, and 135, and the source gas S is sequentially injected through the first, third, and fifth injection openings 131, 133, and 135, and then the reaction gas may be injected through the first, third, and fifth injection opening 231, 233, and 235.

Although not shown in FIG. 1, the first through sixth injection openings 131 through 136 may be separated at regular intervals from each other. That is, after injecting the source gas S, the reaction gas may be injected after moving the substrate 101 by using the driving units 151 and 152.

In addition, six injection openings are formed in the injection unit 130 as shown in FIG. 1; however, the present invention is not limited thereto, that is, two or more injection openings may be formed in the injection unit 130.

Operations of the vapor deposition apparatus 100 according to the present embodiment will now be described.

The substrate 101 is mounted on the mounting surface 121 of the stage 120. After that, the source gas S is injected through the first injection opening 131 of the injection unit 130. Here, the source gas S is injected toward the space G between the substrate 101 and the guide member 140.

In more detail, the source gas S may include aluminum (Al) atoms.

The source gas S is adsorbed on an upper surface (e.g., a surface opposite the surface facing the stage 120) of the substrate 101. After that, an exhaustion process is performed through the exhaust opening 111, and then an atom layer of a single-layered structure or multi-layered structure formed of the source gas S is formed on the upper surface of the substrate 101. That is, a single layer or multiple layers of Al atoms are formed.

After that, the reaction gas is injected through the second injection opening 132 of the injection unit 130. As described above, when the injection openings 131 through 136 of the injection unit 130 are arranged at regular intervals, after injecting the source gas S through the first injection opening 131, the stage 120 and the guide member 140 are moved in the X-axis direction of FIG. 1, that is, the direction denoted by the arrow M, by using the driving units 151 and 152 so that the reaction gas may be injected through the second injection opening 132.

The reaction gas may be injected toward the space G between the substrate 101 and the guide member 140. In more detail, the reaction gas may include oxygen (O) atoms. The reaction gas is adsorbed on the upper surface of the substrate 101. Then, an exhaustion process is performed through the exhaust opening 111, and then, an atom layer of the single-layered structure or multi-layered structure formed of the reaction gas is formed on the upper surface of the substrate 101. That is, a single layer or multi-layers of oxygen atoms are formed.

Therefore, the atom layers of the single-layered structure or the multi-layered structure formed of the source gas S and the reaction gas components are formed on the upper surface of the substrate 101. That is, an aluminum oxide layer ($Al_xO_y$, where x and y may be variable according to processing conditions) is formed. In the present embodiment, the aluminum oxide layer is formed; however, the present invention is not limited thereto. That is, embodiments of the present invention may be applied to processes of forming various insulating layers and conductive layers including oxide layers.

After that, the stage 120 and the guide member 140 are moved in the X-axis direction of FIG. 1, that is, the direction denoted by the arrow M, by using the first and second driving units 151 and 152. Therefore, the space G between the substrate 101 and the guide member 140 may be maintained.

The source gas S is injected through the third injection opening 133 of the injection unit 130 toward the space G between the substrate 101 and the guide member 140. The source gas S is adsorbed on the upper surface of the substrate 101. After that, an exhaustion process is performed by using the exhaust opening 111, and then, an atom layer of a single-layered structure or multi-layered structure formed of the source gas S is formed on the upper surface of the substrate 101.

The reaction gas may be injected toward the space G between the substrate 101 and the guide member 140 through the fourth injection opening 134 of the injection unit 130. The reaction gas is adsorbed on the upper surface of the substrate 101. Then, an exhaustion process is performed through the exhaust opening 111, and then, an atom layer of the single-layered structure or multi-layered structure formed of the reaction gas is formed on the upper surface of the substrate 101.

Therefore, the single-layered atom layer or the multi-layered atom layers including the source gas S and the reaction gas components are additionally formed on the thin film that is formed on the upper surface of the substrate 101 through the first and second injection openings 131 and 132.

After that, the stage 120 and the guide member 140 are moved in the X-axis direction of FIG. 1, that is, the direction denoted by the arrow M, by using the first and second driving units 151 and 152.

The source gas S and the reaction gas are injected toward the space G between the substrate 101 and the guide member 140 through the fifth and sixth injection openings 135 and 136 so that additional thin films may be formed on the substrate 101, like the thin films formed through the first and second injection openings 131 and 132.

Through the above processes, the thin film of desired thickness may be easily formed on the substrate 101 in one chamber 110. That is, moving distance of the stage 120 and the guide member 140 may be controlled according to the desired thickness of the thin film.

According to the present embodiment, the gas is injected from the injection unit 130 in a direction parallel with the upper surface of the substrate 101. In particular, the substrate 101 is disposed in a direction perpendicular to the ground, that is, a direction in which gravity acts. Therefore, when the gas is injected through the injection unit 130 and adsorbed on the substrate 101, an unnecessarily adsorbed amount on the substrate 101 may be reduced. That is, unnecessary adsorbed components on the substrate 101 and other unevenly lumped components fall down due to the gravity, and thus, the unnecessary amount is reduced. In addition, the unnecessary gas component may be easily removed by the exhaustion process through the exhaust opening 111 disposed on a lower portion of the substrate 101. Therefore, after injecting the source gas S through the first injection opening 131 of the injection unit 130, the exhaustion process is performed without performing a purging process using an additional purge gas. After that, the reaction gas is injected through the second injection opening 132, the exhaustion process is performed without performing the purging process using an additional purge gas, and then, the deposition process is finished.

In addition, the guide member 140 is disposed to face the substrate 101 according to the present embodiment. Thus, impurities may be blocked by the guide member 140. For example, when the source gas S is injected through the third injection opening 133, remaining impurity gas that remains after forming the thin film on the substrate 101 among the source gas or the reaction gas that is injected through the first and second injection openings 131 and 132 in the previous process may not be exhausted completely through the exhaust opening 111. In this case, the process of forming the thin film by using the source gas S injected through the third injection opening 133 is affected by the impurity gas, and thereby degrading characteristics of the thin film formed on the substrate 101. However, according to the present embodiment, the space G is formed between the substrate 101 and the guide member 140, and the source gas S is injected toward the space through the third injection opening 133 so that the guide member 140 may prevent or block the impurity away from the substrate 101.

In addition, the source gas S injected through the third injection opening 133 is not as dispersed, and is effectively adsorbed on the substrate 101 between the substrate 101 and the guide member 140, and thereby improving the thin film deposition efficiency.

As a result, efficiency of the deposition process for forming desired thin films may be greatly improved. In addition, adsorption of the unnecessary gas components may be reduced or prevented, and mixture of purge gas impurities into the thin films formed on the substrate 101 may be reduced or prevented. Therefore, the thin films may be evenly formed, and have excellent physical and chemical characteristics.

In addition, according to the present embodiment, the deposition processes are performed while moving the stage 120 and the guide member 140 by using the driving units 151 and 152. As such, the deposition processes can be sequentially performed through the first through sixth injection openings 131 through 136, and thus, time that is needed for forming the thin film of desired thickness may be greatly reduced and the convenience of deposition processes is improved.

Figure 2:
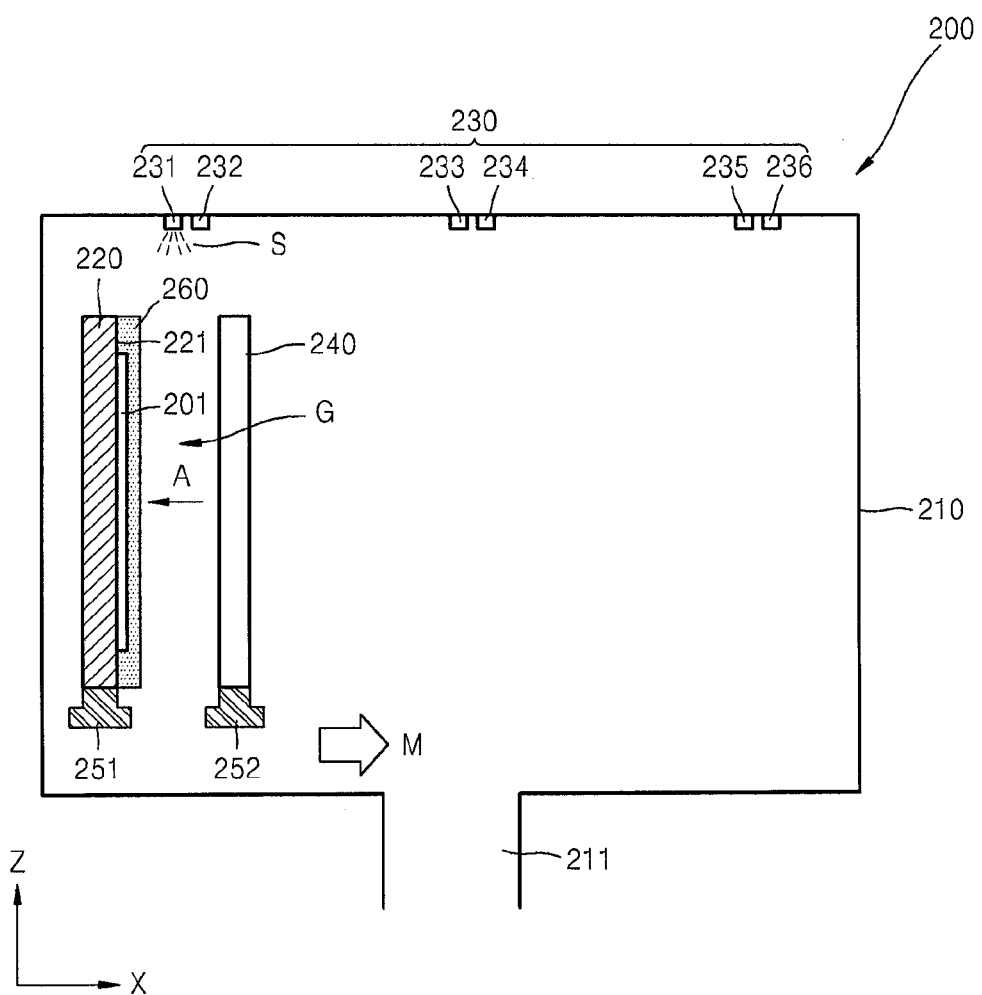
FIG. 2 is a schematic cross-sectional view of a vapor deposition apparatus according to another embodiment of the present invention.
Figure 3:
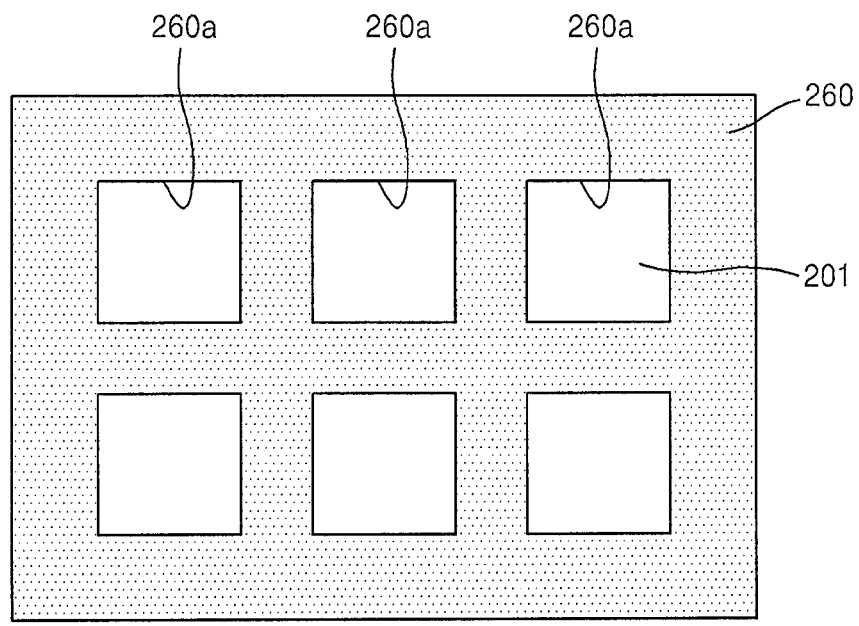
FIG. 3 is a diagram of the vapor deposition apparatus seen from a direction A of FIG. 2.

FIG. 2 is a schematic cross-sectional view of a vapor deposition apparatus 200 according to another embodiment of the present invention, and FIG. 3 is a diagram of the vapor deposition apparatus seen from a direction A of FIG. 2.

Referring to FIGS. 2 and 3, a vapor deposition apparatus 200 includes a chamber 210, a stage 220, an injection unit 230, a guide member 240, first and second driving units 251 and 252, and a mask 260.

The chamber 210 includes an exhaust opening 211 on a lower portion thereof. The exhaust opening 211 is an outlet that exhausts gas, and may be connected to a pump so as to perform the exhaustion sufficiently.

Although not shown in FIGS. 2 and 3, the chamber 210 is controlled by a pump so as to maintain a suitable pressure (e.g., a predetermined pressure). In addition, a heating unit (not shown) for heating inside of the chamber 210 may be disposed on an inner or outer portion of the chamber 210 so as to improve efficiency of a thin film deposition process.

The stage 220 is disposed in the chamber 210. The stage 220 includes a mounting surface 221. The mounting surface 221 is disposed in parallel with a direction in which gravity is applied. That is, the mounting surface 221 is disposed perpendicularly to ground. To do this, the stage 220 is disposed perpendicularly to the ground.

A substrate 201 is disposed on the stage 220. In more detail, the substrate 201 is mounted on the mounting surface 221 of the stage 220.

A fixing unit (not shown) may be disposed on the mounting surface 221 so that the substrate 201 may be fixed after being mounted on the mounting surface 221. The fixing unit (not shown) may be a clamp, a compressing unit, an adhesive material, or other materials.

The mask 260 is disposed on the substrate 201. Referring to FIG. 3, the mask 260 includes a mask opening 260*a* having a suitable shape (e.g., a predetermined shape), which is a rectangular shape in FIG. 3, but is limited thereto. The mask opening 260*a* corresponds to a pattern of the thin film that will be formed on the substrate 201.

FIG. 3 shows six mask openings 260*a;* however, the present invention is not limited thereto. That is, the number and shape of the mask openings 260*a* may be determined according to the number of patterns that are wanted to be formed on the substrate 201. for example, the mask 260 may be an open mask having one mask opening 260*a*.

The guide member 240 is disposed to face the substrate 201. Thus, a space G is formed between the substrate 201 and the guide member 240. The guide member 240 may be disposed in parallel with the substrate. In addition, the guide member 240 is formed as a flat plate having a size that is equal to or greater than that of the substrate 201.

The first and second driving units 251 and 252 are connected to the stage 220 and the guide member 240. In more detail, the first driving unit 251 is connected to the stage 220, and the second driving unit 252 is connected to the guide member 240.

The first driving unit 251 conveys the stage 220 in a direction denoted by an arrow M shown in FIG. 2, or an opposite direction to the direction denoted by the arrow M. That is, the first driving unit 251 conveys the stage 220 in an X-axis direction of FIG. 2. Thus, the substrate 201 may be moved in a direction perpendicular to a surface of the substrate 201, that is, a surface on which a thin film will be formed.

In addition, the second driving unit 252 conveys the guide member 240 in the direction denoted by the arrow M shown in FIG. 2, or an opposite direction to the direction denoted by the arrow M. That is, the second driving unit 252 conveys the guide member 240 in an X-axis direction of FIG. 1. Thus, the guide member 240 may be moved in a direction perpendicular to a surface of the substrate 201, that is, a surface on which a thin film will be formed.

The first and second driving units 251 and 252 are controlled to maintain the space G between the substrate 201 and the guide member 240.

The injection unit 230 is connected to the chamber 210. One or more gases are injected toward the substrate 201 through the injection unit 230. In more detail, the injection unit 230 includes a first injection opening 231, a second injection opening 232, a third injection opening 233, a fourth injection opening 234, a fifth injection opening 235, and a sixth injection opening 236.

In addition, the first through sixth injection openings 231 through 236 are arranged along a moving direction of the substrate 201. That is, the first through sixth injection openings 231 through 236 are arranged in the X-axis direction of FIG. 2 and separated from each other.

In addition, the first through sixth injection openings 231 through 236 may be formed to have various shapes, for example, may be formed as dots or lines corresponding to a width of the substrate 201.

A gas is injected into the chamber 210 through the first through sixth injection openings 231 through 236 in parallel with a surface direction of the substrate 201. That is, the gas is injected through the first through sixth injection openings 231 through 236 in parallel with a direction in which gravity acts.

In more detail, a source gas S is injected through the first, third, and fifth injection openings 231, 233, and 235, and a reaction gas is injected through the second, fourth, and sixth injection openings 232, 234, and 236.

While the source gas S is injected through the first, third, and fifth injection openings 231, 233, and 235, the reaction gas is not injected through the second, fourth, and sixth injection openings 232, 234, and 236. After injecting the source gas S through the first, third, and fifth injection openings 231, 233, and 235, the reaction gas is injected through the second, fourth, and sixth injection openings 232, 234, and 236.

In addition, the source gas S may be sequentially, concurrently, or simultaneously injected through the first, third, and fifth injection openings 231, 233, and 235. Likewise, the reaction gas may be injected sequentially, concurrently, or simultaneously injected through the second, fourth, and sixth injection openings 232, 234, and 236.

However, the present invention is not limited to the above example. That is, the source gas S and the reaction gas may be injected through the same injection openings of the injection unit 230. For example, the injection unit 230 may include only the first, third, and fifth injection openings 231, 233, and 235, and the source gas S is sequentially injected through the first, third, and fifth injection openings 231, 233, and 235, and then the reaction gas may be injected through the first, third, and fifth injection openings 231, 233, and 235.

Although not shown in FIG. 2, the first through sixth injection openings 231 through 236 may be separated at regular intervals from each other. That is, after injecting the source gas S, the reaction gas may be injected after moving the substrate 201 by using the driving units 251 and 252.

Operations of the vapor deposition apparatus 200 according to the present embodiment will now be described.

The substrate 201 is mounted on the mounting surface 221 of the stage 220. The mask 260 having an opening 260a that corresponds to a pattern of a thin film that will be formed on the substrate 201 is disposed on the substrate 201.

After that, the source gas S is injected through the first injection opening 231 of the injection unit 230. Here, the source gas S is injected toward the space G between the substrate 201 and the guide member 240.

The source gas S is adsorbed on an upper surface of the substrate 201. In particular, the source gas S is adsorbed on a portion of the upper surface of the substrate 201, which corresponds to the opening 260a of the mask 260.

After that, an exhaustion process is performed through the exhaust opening 211, and then an atom layer of a single-layered structure or multi-layered structure formed of the source gas S is formed on the upper surface of the substrate 201.

After that, the reaction gas is injected through the second injection opening 232 of the injection unit 230. Here, the reaction gas is injected toward the space G between the substrate 201 and the guide member 240. The reaction gas is adsorbed on the upper surface of the substrate 201, in particular, on a portion corresponding to the opening 260a of the mask 260.

Then, an exhaustion process is performed through the exhaust opening 211, and then, an atom layer of the single-layered structure or multi-layered structure formed of the reaction gas is formed on the upper surface of the substrate 201.

Thus, the atom layers of single-layered structure or multi-layered structure formed of the source gas S and the reaction gas are formed on the upper surface of the substrate 201 so as to correspond to the opening 260a of the mask 260.

After that, the stage 220 and the guide member 240 are moved in the X-axis direction of FIG. 2, that is, the direction denoted by the arrow M, by using the first and second driving units 251 and 252. After moving the stage 220 and the guide member 240, the space G between the substrate 201 and the guide member 240 may be maintained.

The source gas S is injected through the third injection opening 233 of the injection unit 230 toward the space G between the substrate 201 and the guide member 240. The source gas S is adsorbed on the upper surface of the substrate 201, in particular, on a portion corresponding to the opening 260a of the mask 260. Then, an exhaustion process is performed through the exhaust opening 211, and the single-layered atom layer or the multi-layered atom layer including the source gas S is formed on the upper surface of the substrate 201.

Then, the reaction gas is injected toward the space G between the substrate 201 and the guide member 240 through the fourth injection opening 234 of the injection unit 230. The reaction gas is adsorbed on the portion of the upper surface of the substrate 201, which corresponds to the opening 260a of the mask 260. After that, the exhaustion is performed through the exhaust opening 211, and then, the atom layer having the single-layered or multi-layered structure of the reaction gas is formed on the upper surface of the substrate 201.

Therefore, the single-layered atom layer or the multi-layered atom layers including the source gas S and the reaction gas components are additionally formed on the thin film that is formed on the upper surface of the substrate 201 through the first and second injection openings 231 and 232.

After that, the stage 220 and the guide member 240 are moved in the X-axis direction of FIG. 2, that is, the direction denoted by the arrow M, by using the first and second driving units 251 and 252.

The source gas S and the reaction gas are injected toward the space G between the substrate 201 and the guide member 240 through the fifth and sixth injection openings 235 and 236 so that additional thin films may be formed on the substrate 201, like the thin films formed through the first and second injection openings 231 and 232.

Through the above processes, the thin film of desired thickness may be easily formed on the substrate 201 in one chamber 210. That is, moving distance of the stage 220 and the guide member 240 may be controlled according to the desired thickness of the thin film.

In the present embodiment, the mask 260 is disposed on the substrate 201 so as to easily form the thin film of the desired pattern on the substrate 201.

According to the present embodiment, the gas is injected from the injection unit 230 in a direction parallel with the upper surface of the substrate 201. In particular, the substrate 201 is disposed in a direction perpendicular to the ground, that is, a direction in which gravity acts. Therefore, when the gas is injected through the injection unit 230 and adsorbed on the substrate 201, an unnecessarily adsorbed amount on the substrate 201 may be reduced. That is, unnecessary adsorbed components on the substrate 201 and other unevenly lumped components fall down due to the gravity, and thus, the unnecessary amount is reduced. In addition, the unnecessary gas component may be easily removed by the exhaustion process through the exhaust opening 211 disposed on a lower portion of the substrate 201. Therefore, after injecting the source gas S through the first injection opening 231 of the injection unit 230, the exhaustion process is performed without performing a purging process using an additional purge gas. After that, the reaction gas is injected through the second injection opening 232, the exhaustion process is performed without performing the purging process using an additional purge gas, and then, the deposition process is finished.

In addition, the guide member 240 is disposed to face the substrate 201 according to the present embodiment. Thus, impurities may be blocked by the guide member 240. In addition, the source gas S injected through the injection unit 230 is not as dispersed, and is effectively adsorbed on the substrate 201 between the substrate 201 and the guide member 240, and thereby improving the thin film deposition efficiency.

As a result, efficiency of the deposition process for forming desired thin films may be greatly improved. In addition, adsorption of the unnecessary gas components may be reduced or prevented, and mixture of purge gas impurities into the thin films formed on the substrate 201 may be reduced or prevented. Therefore, the thin films may be evenly formed, and have excellent physical and chemical characteristics.

In addition, according to the present embodiment, the deposition processes are sequentially performed while moving the stage 220 and the guide member 240 by using the driving units 251 and 252. Therefore, time that is taken for forming the thin film of desired thickness may be greatly reduced and the convenience of deposition processes is improved.

Figure 4:
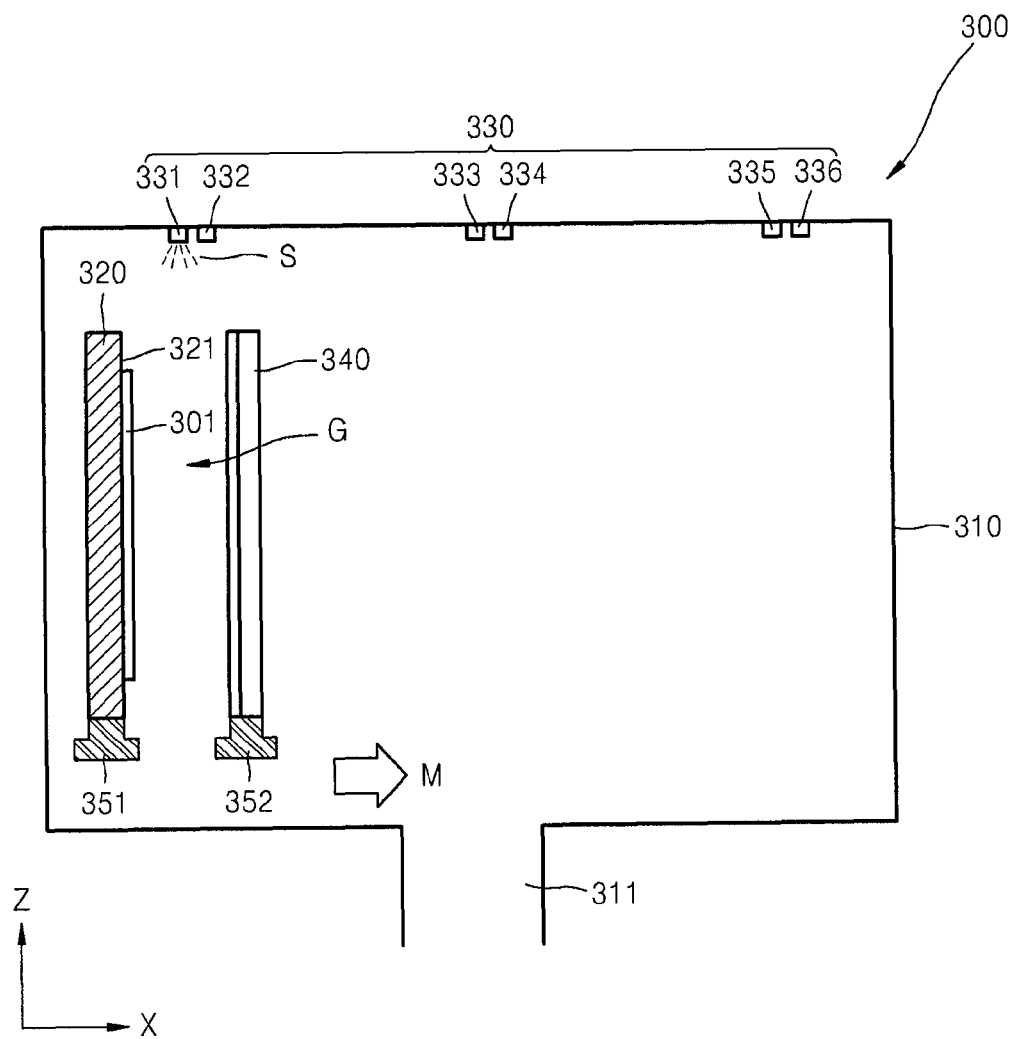
FIG. 4 is a schematic cross-sectional view of a vapor deposition apparatus according to another embodiment of the present invention.
Figure 5:
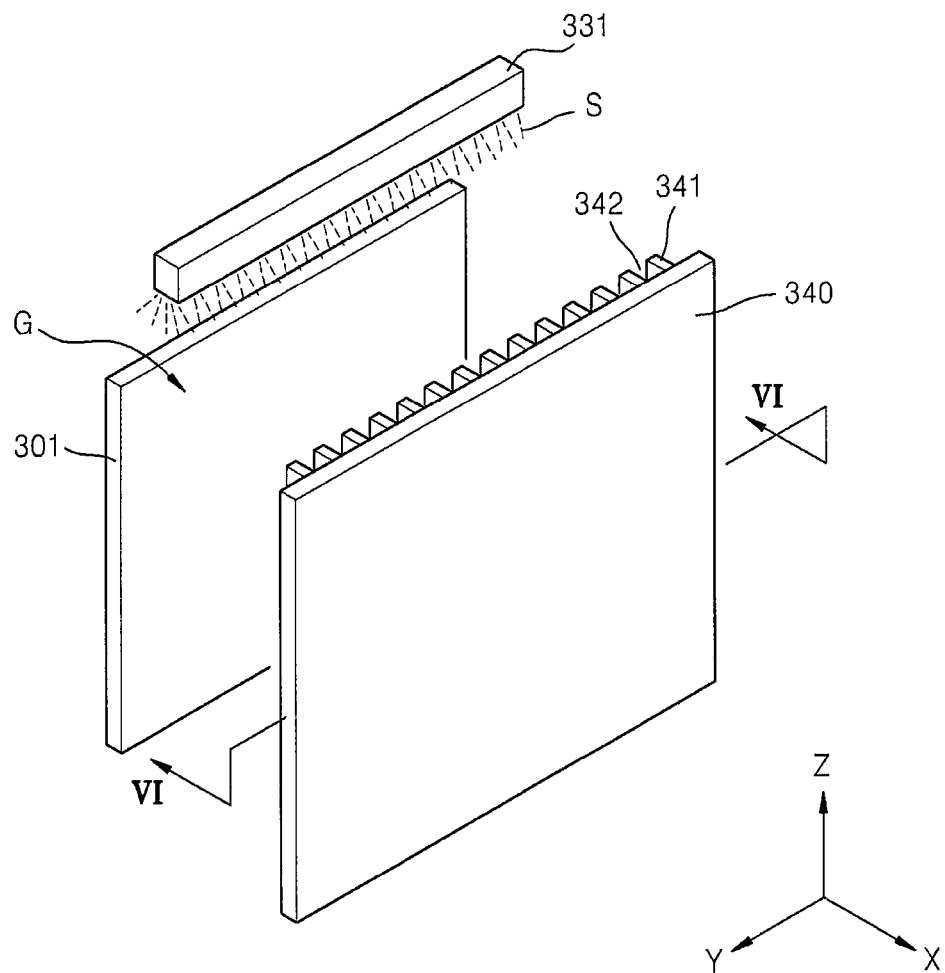
FIG. 5 is a schematic perspective view of a substrate and a guide member shown in FIG. 4.
Figure 6:
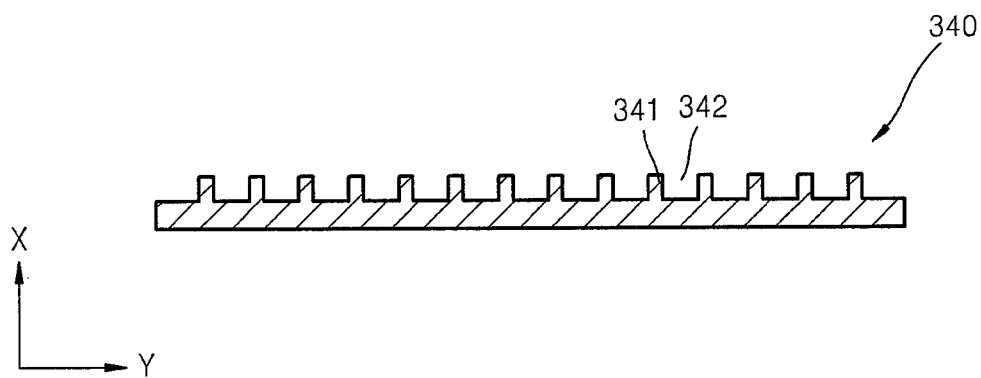
FIG. 6 is a schematic cross-sectional view of the substrate and the guide member taken along line VI-VI of FIG. 5.

FIG. 4 is a front view of a vapor deposition apparatus 300 according to another embodiment of the present invention. FIG. 5 is a schematic perspective view of a substrate and a guide member shown in FIG. 4, and FIG. 6 is a cross-sectional view of the substrate and the guide member taken along line VI-VI of FIG. 5.

The vapor deposition apparatus 300 includes a chamber 310, a stage 320, an injection unit 330, a guide member 340, and first and second driving units 351 and 352.

The chamber 310 includes an exhaust opening 311 on a lower portion thereof. The exhaust opening 311 is an outlet that exhausts gas, and may be connected to a pump so as to perform the exhaustion sufficiently.

Although not shown in FIG. 4, the chamber 310 is controlled by a pump so as to maintain a suitable pressure (e.g., a predetermined pressure). In addition, a heating unit (not shown) for heating inside of the chamber 310 may be disposed on an inner or outer portion of the chamber 310 so as to improve efficiency of a thin film deposition process.

The stage 320 is disposed in the chamber 310. The stage 320 includes a mounting surface 321. The mounting surface 321 is disposed in parallel with a direction in which gravity is applied. That is, the mounting surface 321 is disposed perpendicularly to ground. To do this, the stage 320 is disposed perpendicularly to the ground.

A substrate 301 is disposed on the stage 320. In more detail, the substrate 301 is mounted on the mounting surface 321 of the stage 320.

A fixing unit (not shown) may be disposed on the mounting surface 321 so that the substrate 301 may be fixed after being mounted on the mounting surface 321. The fixing unit (not shown) may be a clamp, a compressing unit, an adhesive material, or other materials.

The guide member 340 is disposed to face the substrate 301. Thus, a space G is formed between the substrate 301 and the guide member 340. The guide member 340 may be disposed in parallel with the substrate.

In addition, the guide member 340 is formed to have a size that is equal to or greater than that of the substrate 301 so as to correspond to the substrate 301.

The guide member 340 has an irregular surface that faces the substrate 301. That is, the guide member 340 includes convex portions 341 and concave portions 342 facing the substrate 301. The concave portions 342 are disposed between two adjacent convex portions 341. In addition, the convex and concave portions 341 and 342 are extended from an upper portion toward a lower portion along a direction, in which gravity acts.

The first and second driving units 351 and 352 are connected to the stage 320 and the guide member 340. In more detail, the first driving unit 351 is connected to the stage 320, and the second driving unit 352 is connected to the guide member 340.

The first driving unit 351 conveys the stage 320 in a direction denoted by an arrow M shown in FIG. 4, or an opposite direction to the direction denoted by the arrow M. That is, the first driving unit 351 conveys the stage 320 in an X-axis direction of FIG. 4. Thus, the substrate 301 may be moved in a direction perpendicular to a surface of the substrate 301, that is, a surface on which a thin film will be formed.

In addition, the second driving unit 352 conveys the guide member 340 in the direction denoted by the arrow M shown in FIG. 4, or an opposite direction to the direction denoted by the arrow M. That is, the second driving unit 352 conveys the guide member 340 in an X-axis direction of FIG. 4. Thus, the guide member 340 may be moved in a direction perpendicular to a surface of the substrate 301, that is, a surface on which a thin film will be formed.

The first and second driving units 351 and 352 are controlled to maintain the space G between the substrate 301 and the guide member 340.

The injection unit 330 is connected to the chamber 310. One or more gases are injected toward the substrate 301 through the injection unit 330. In more detail, the injection unit 330 includes a first injection opening 331, a second injection opening 332, a third injection opening 333, a fourth injection opening 334, a fifth injection opening 335, and a sixth injection opening 336.

In addition, the first through sixth injection openings 331 through 336 are arranged along a moving direction of the substrate 301. That is, the first through sixth injection openings 331 through 336 are arranged in the X-axis direction of FIG. 4 and separated from each other.

In addition, the first through sixth injection openings 331 through 336 may be formed to have various shapes, for example, may be formed as dots or lines corresponding to a width of the substrate 301. That is, in FIG. 5, the first injection opening 331 is formed as a line; however, the present invention is not limited thereto, that is, the first injection opening 331 may be formed as a dot.

A gas is injected into the chamber 210 through the first through sixth injection openings 231 through 236 in parallel with a surface direction of the substrate 201. That is, the gas is injected through the first through sixth injection openings 231 through 236 in parallel with a direction in which gravity acts.

In more detail, a source gas S is injected through the first, third, and fifth injection openings 331, 333, and 335, and a reaction gas is injected through the second, fourth, and sixth injection openings 332, 334, and 336.

While the source gas S is injected through the first, third, and fifth injection openings 331, 333, and 335, the reaction gas is not injected through the second, fourth, and sixth injection openings 332, 334, and 336. After injecting the source gas S through the first, third, and fifth injection openings 331, 333, and 335, the reaction gas is injected through the second, fourth, and sixth injection openings 332, 334, and 336.

In addition, the source gas S may be sequentially, concurrently, or simultaneously injected through the first, third, and fifth injection openings 331, 333, and 335. Likewise, the reaction gas may be injected sequentially, concurrently, or simultaneously injected through the second, fourth, and sixth injection openings 332, 334, and 336.

However, the present invention is not limited to the above example. That is, the source gas S and the reaction gas may be injected through the same injection openings of the injection unit 330. For example, the injection unit 330 may include only the first, third, and fifth injection openings 331, 333, and 335, and the source gas S is sequentially injected through the first, third, and fifth injection openings 331, 333, and 335, and then the reaction gas may be injected through the first, third, and fifth injection openings 331, 333, and 335.

Although not shown in the drawings, the first through sixth injection openings 331 through 336 may be separated at regular intervals from each other. That is, after injecting the source gas S, the reaction gas may be injected after moving the substrate 301 by using the driving units 351 and 352.

Operations of the vapor deposition apparatus 300 according to the present embodiment will now be described.

The substrate 301 is mounted on the mounting surface 321 of the stage 320. After that, the source gas S is injected through the first injection opening 331 of the injection unit 330. Here, the source gas S is injected toward the space G between the substrate 301 and the guide member 340.

The source gas S is adsorbed on an upper surface of the substrate 301. After that, an exhaustion process is performed through the exhaust opening 311, and then an atom layer of a single-layered structure or multi-layered structure formed of the source gas S is formed on the upper surface of the substrate 301.

After that, the reaction gas is injected through the second injection opening 332 of the injection unit 330. Here, the reaction gas is injected toward the space G between the substrate 301 and the guide member 340.

The reaction gas is adsorbed on the upper surface of the substrate 301. Then, an exhaustion process is performed through the exhaust opening 311, and then, an atom layer of the single-layered structure or multi-layered structure formed of the reaction gas is formed on the upper surface of the substrate 301. That is, a single layer or multi-layers of oxygen atoms are formed on the substrate 301.

Through the above processes, the atom layers of single-layered structure or multi-layered structure formed of the source gas S and the reaction gas are formed on the upper surface of the substrate 301.

After that, the stage 320 and the guide member 340 are moved in the X-axis direction of FIG. 4, that is, the direction denoted by the arrow M, by using the first and second driving units 351 and 352. After moving the stage 320 and the guide member 340, the space G between the substrate 301 and the guide member 340 may be maintained.

The source gas S and the reaction gas are injected through the third and fourth injection openings 333 and 334 of the injection unit 330 toward the space G between the substrate 301 and the guide member 340 so as to form an additional thin film on the substrate 301 like the thin film formed by using the first and second injection openings 331 and 332.

After that, the stage 320 and the guide member 340 are moved in the X-axis direction of FIG. 4, that is, the direction denoted by the arrow M, by using the first and second driving units 351 and 352. The source gas S and the reaction gas are injected through the fifth and sixth injection openings 335 and 336 of the injection unit 330 toward the space G between the substrate 301 and the guide member 340 so as to form an additional thin film on the substrate 301 like the thin film formed by using the first and second injection openings 331 and 332.

Through the above processes, the thin film of desired thickness may be easily formed on the substrate 301 in one chamber 310.

According to the present embodiment, the gas is injected from the injection unit 330 in a direction parallel with the upper surface of the substrate 301. In particular, the substrate 301 is disposed in a direction perpendicular to the ground, that is, a direction in which gravity acts. Therefore, when the gas is injected through the injection unit 330 and adsorbed on the substrate 301, an unnecessarily adsorbed amount on the substrate 301 may be reduced. Therefore, after injecting the source gas S through the first injection opening 331 of the injection unit 330, the exhaustion process is performed without performing a purging process using an additional purge gas. After that, the reaction gas is injected through the second injection opening 332, the exhaustion process is performed without performing the purging process using an additional purge gas, and then, the deposition process is finished.

In addition, adsorption of the unnecessary gas components may be prevented, and mixture of purge gas impurities into the thin films formed on the substrate 301 may be prevented.

Therefore, the thin films may be evenly formed, and have excellent physical and chemical characteristics.

In addition, the guide member 340 is disposed to face the substrate 301 according to the present embodiment. Thus, impurities may be blocked by the guide member 340. In addition, the source gas S injected through the injection unit 330 is not as dispersed, and is effectively adsorbed on the substrate 301 between the substrate 301 and the guide member 340, and thereby improving the thin film deposition efficiency. For example, when the source gas S is injected through the third injection opening 333, remaining impurity gas that remains after forming the thin film on the substrate 301 among the source gas or the reaction gas that is injected through the first and second injection openings 331 and 332 in the previous process may not be exhausted completely through the exhaust opening 311. In this case, the process of forming the thin film by using the source gas S injected through the third injection opening 333 is affected by the impurity gas, and thereby degrading characteristics of the thin film formed on the substrate 301. However, according to the present embodiment, the space G is formed between the substrate 301 and the guide member 340, and the source gas S is injected toward the space through the third injection opening 333 so that the guide member 340 may prevent or block the impurity away from the substrate 301.

In addition, the source gas S injected through the third injection opening 333 is not as dispersed, and is effectively adsorbed on the substrate 301 between the substrate 301 and the guide member 340, and thereby improving the thin film deposition efficiency.

Moreover, the guide member 340 of the present embodiment further includes the irregular surface having the convex portions 341 and the concave portions 342, and facing the substrate 301. In more detail, the convex portions 341 and the concave portions 342 are elongated in the direction in which gravity acts, that is, the longitudinal direction. The convex portions 341 and the concave portions 342 perform as paths in which the gas injected from the injection unit 330 may proceed toward the substrate 301 without being as dispersed. That is, in FIGS. 5 and 6, the convex portions 341 and the concave portions 342 make the injected gases move straight downward in a Z-axis direction without overly dispersing in a Y-axis direction, so that reaction efficiency between the injected gases and the substrate 301 may be improved.

Therefore, the efficiency of the deposition process for forming the thin film of desired thickness is greatly improved, and thereby improving thin film characteristics.

In addition, according to the present embodiment, the deposition processes are sequentially performed while moving the stage 320 and the guide member 340 by using the driving units 351 and 352. Therefore, time that is taken for forming the thin film of desired thickness may be greatly reduced and the convenience of deposition processes is improved by performing the deposition processes sequentially through the first through sixth injection openings 331 through 336.

Figure 7:
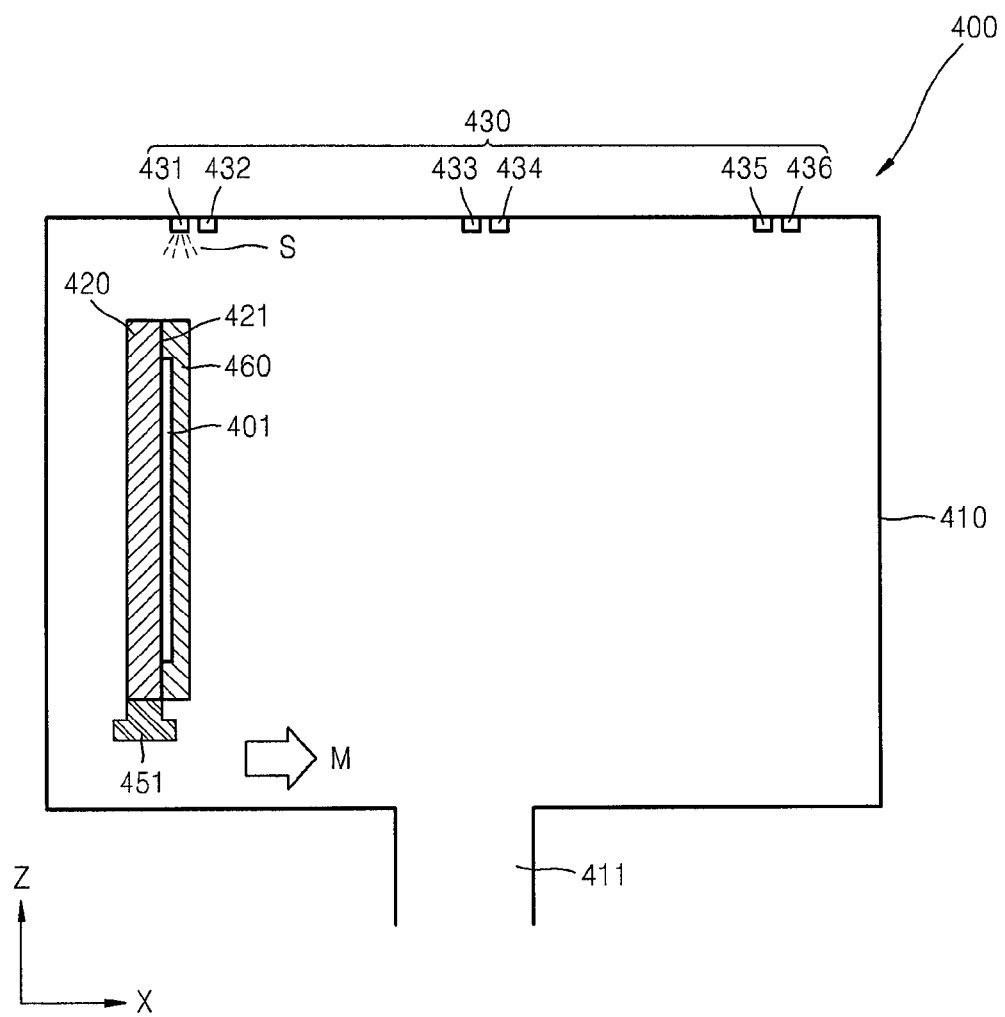
FIG. 7 is a schematic cross-sectional view of a vapor deposition apparatus according to another embodiment of the present invention.
Figure 8:
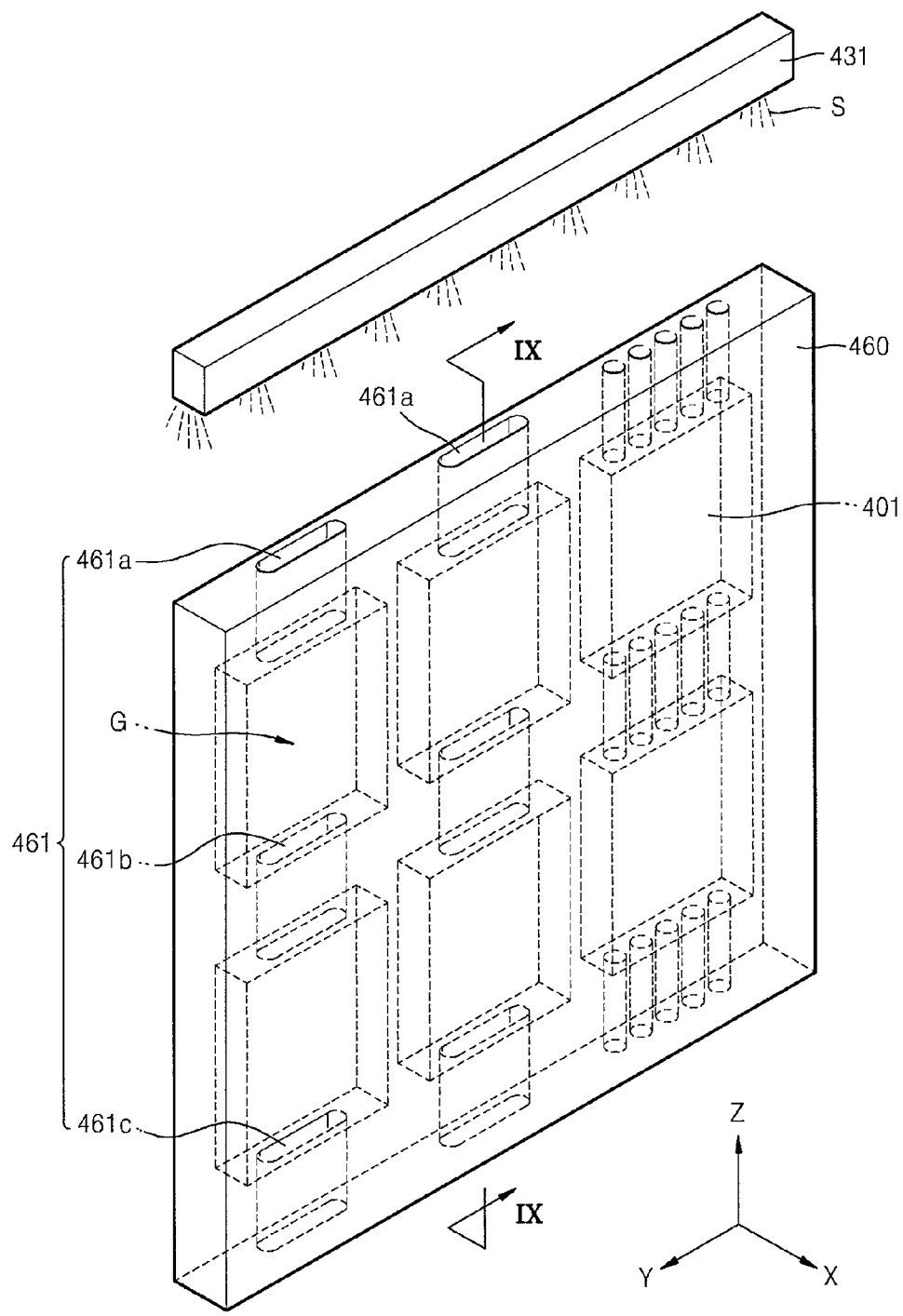
FIG. 8 is a schematic projecting perspective view of a guide member shown in FIG. 7.
Figure 9:
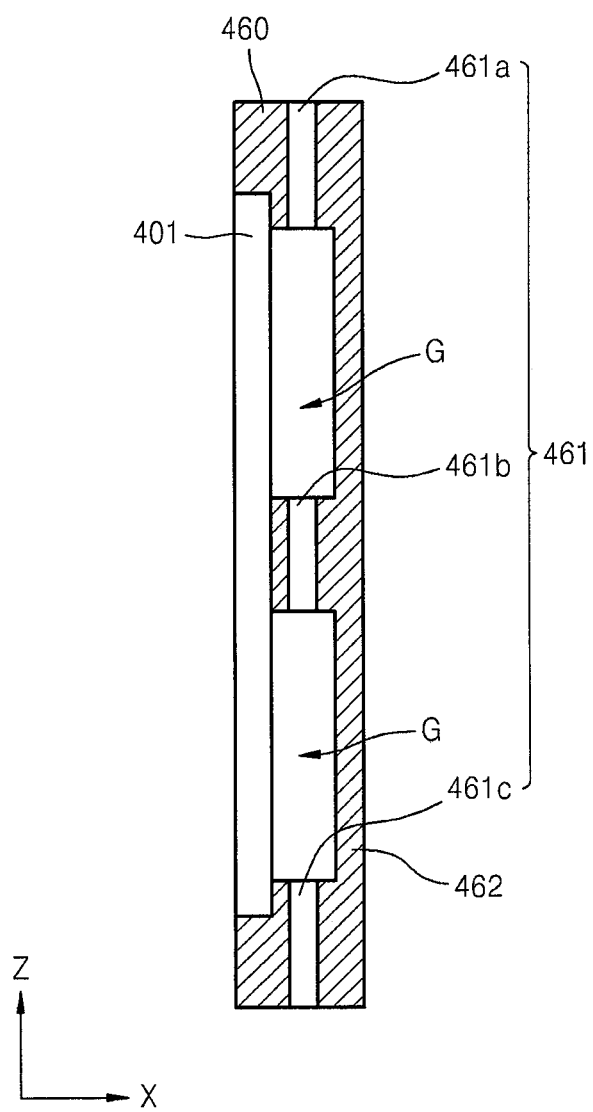
FIG. 9 is a schematic cross-sectional view of the guide member taken along line IX-IX of FIG. 8.

FIG. 7 is a schematic cross-sectional view of a vapor deposition apparatus 400 according to another embodiment of the present invention, FIG. 8 is a projecting perspective view of a guide member 460 shown in FIG. 7, and FIG. 9 is a cross-sectional view of the guide member taken along line IX-IX of FIG. 8.

Referring to FIGS. 7 through 9, the vapor deposition apparatus 400 includes a chamber 410, a stage 420, an injection unit 430, a guide member 460, and a driving unit 451.

The chamber 410 includes an exhaust opening 411 on a lower portion thereof. The exhaust opening 311 is an outlet that exhausts gas, and may be connected to a pump so as to perform the exhaustion sufficiently.

Although not shown in FIGS. 7 through 9, the chamber 410 is controlled by a pump so as to maintain a suitable pressure (e.g., a predetermined pressure). In addition, a heating unit (not shown) for heating inside of the chamber 410 may be disposed on an inner or outer portion of the chamber 410 so as to improve efficiency of a thin film deposition process.

The stage 420 is disposed in the chamber 410. The stage 420 includes a mounting surface 421. The mounting surface 421 is disposed in parallel with a direction in which gravity is applied. That is, the mounting surface 421 is disposed perpendicularly to ground. To do this, the stage 420 is disposed perpendicularly to the ground.

A substrate 401 is disposed on the stage 420. In more detail, the substrate 401 is mounted on the mounting surface 421 of the stage 420.

A fixing unit (not shown) may be disposed on the mounting surface 421 so that the substrate 401 may be fixed after being mounted on the mounting surface 421. The fixing unit (not shown) may be a clamp, a compressing unit, an adhesive material, or other suitable materials or devices.

The guide member 460 is disposed to face the substrate 401. The guide member 460 may be coupled to the stage 420. That is, edges of the guide member 460 may be coupled to the stage 420.

The guide member 460 is disposed on the substrate 401. In addition, the guide member 460 has a size that is equal to or greater than that of the substrate 401 so as to correspond to the substrate 401.

The guide member 460 includes paths 461 through which the gases injected from the injection unit 430 may pass. The path 461 includes a first penetration portion (e.g., a channel) 461a and a second penetration portion 461c. In more detail, the first penetration portion 461a is formed on an upper end of the guide member 460, and the second penetration portion 461 c is formed on a lower end of the guide member 460. A connecting penetration portion 461b is formed between the first and second penetration portions 461a and 461c.

In addition, the guide member 460 includes a space G formed as a suitable shape (e.g., a predetermined shape). The space G may be a groove formed by removing a surface of the guide member 460 to a suitable depth (e.g., a predetermined depth). The space G has a shape corresponding to a pattern of a thin film that will be formed on the substrate 401. In addition, the space G contacts an upper surface of the substrate 401.

That is, the space G is formed between the substrate 401 and the guide member 460. The gases injected through the path 461 react with the substrate 401 in the space G.

In particular, the guide member 460 includes a cover 462 disposed on the space G so as not to expose the space G out of the cover 462. In FIGS. 8 and 9, the cover 462 is formed as a part of the guide member 460; however, the present invention is not limited thereto. That is, the cover 462 may be separately formed with the guide member 460.

FIG. 8 shows six spaces G; however, the present invention is not limited thereto. That is, the number and shapes of the spaces G may be determined according to the number of patterns that are to be formed on the substrate 401. For example, the guide member 460 may be formed as an open mask having one space G.

The space G is connected to the path 461. Thus, the gas is injected into the space G through the injection unit 430 so as to form the thin film having the pattern corresponding to the space G.

The first and second penetration portions 461a and 461c may be formed to have various shapes. That is, as shown in FIG. 8, the first and second penetration portions 461a and 461c may be elongated to correspond to the space G, or may include a plurality of penetrating openings. Both of the above shapes are shown in FIG. 8; however, the present invention is not limited thereto. That is, the first and second penetration portions 461a and 461c may be formed to have only one shape.

The driving unit 451 is connected to the stage 420. The driving unit 451 conveys the stage 420 in a direction denoted by an arrow M shown in FIG. 7, or an opposite direction to the direction denoted by the arrow M. That is, the driving unit 451 conveys the stage 420 in an X-axis direction of FIG. 7. Thus, the substrate 401 may be moved in a direction perpendicular to a surface of the substrate 401, that is, a surface on which a thin film will be formed. Accordingly, the guide member 460 and the stage 420 are moved concurrently or simultaneously.

The injection unit 430 is connected to the chamber 410. One or more gases are injected toward the substrate 401 through the injection unit 430. In more detail, the injection unit 430 includes a first injection opening 431, a second injection opening 432, a third injection opening 433, a fourth injection opening 434, a fifth injection opening 435, and a sixth injection opening 436.

In addition, the first through sixth injection openings 431 through 436 are arranged along a moving direction of the substrate 401. That is, the first through sixth injection openings 431 through 436 are arranged in the X-axis direction of FIG. 7 to be separated from each other.

In addition, the first through sixth injection openings 431 through 436 may be formed to have various shapes, for example, may be formed as dots or lines corresponding to a width of the substrate 401. That is, in FIG. 8, the first injection opening 431 is formed as a line; however, the present invention is not limited thereto, that is, the first injection opening 431 may be formed as a dot.

A gas is injected into the chamber 410 through the first through sixth injection openings 431 through 436 in parallel with a surface direction of the substrate 401. That is, the gas is injected through the first through sixth injection openings 431 through 436 in parallel with a direction in which gravity acts.

In more detail, a source gas S is injected through the first, third, and fifth injection openings 431, 433, and 435, and a reaction gas is injected through the second, fourth, and sixth injection openings 432, 434, and 436.

While the source gas S is injected through the first, third, and fifth injection openings 431, 433, and 435, the reaction gas is not injected through the second, fourth, and sixth injection openings 432, 434, and 436. After injecting the source gas S through the first, third, and fifth injection openings 431, 433, and 435, the reaction gas is injected through the second, fourth, and sixth injection openings 432, 434, and 436.

In addition, the source gas S may be sequentially or simultaneously injected through the first, third, and fifth injection openings 431, 433, and 435. Likewise, the reaction gas may be injected sequentially or simultaneously injected through the second, fourth, and sixth injection openings 432, 434, and 436.

However, the present invention is not limited to the above example. That is, the source gas S and the reaction gas may be injected through the same injection openings of the injection unit 430. For example, the injection unit 430 may include the first, third, and fifth injection openings 431, 433, and 435, and the source gas S is sequentially injected through the first, third, and fifth injection openings 431, 433, and 435, and then the reaction gas may be injected through the first, third, and fifth injection openings 431, 433, and 435.

Although not shown in the drawings, the first through sixth injection openings 431 through 436 may be separated at regular intervals from each other. That is, after injecting the source gas S, the reaction gas may be injected after moving the substrate 401 by using the driving unit 451.

Operations of the vapor deposition apparatus 400 according to the present embodiment will now be described.

The substrate 401 is mounted on the mounting surface 421 of the stage 420. The guide member 460 having the space G that corresponds to the pattern of the thin film to be formed on the substrate 401 is disposed on the substrate 401.

After that, the source gas S is injected through the first injection opening 431 of the injection unit 430. Here, the source gas S is injected toward the space G between the substrate 401 and the guide member 460. In more detail, the source gas S is injected through the first penetration portion 461a so as to proceed in the path 461.

The source gas S is adsorbed on an upper surface of the substrate 401, in particular, to a portion corresponding to the space G.

After that, an exhaustion process is performed through the exhaust opening 411, and then an atom layer of a single-layered structure or multi-layered structure formed of the source gas S is formed on the upper surface of the substrate 401.

In addition, the reaction gas is injected through the second injection opening 432 of the injection unit 430. Here, the reaction gas is injected toward the space G between the substrate 401 and the guide member 460. In more detail, the reaction gas is injected through the first penetration portion 461a so as to proceed in the path 461.

The reaction gas is adsorbed on the upper surface of the substrate 401, in particular, on a portion corresponding to the space G.

Then, an exhaustion process is performed through the exhaust opening 411, and then, an atom layer of the single-layered structure or multi-layered structure formed of the reaction gas is formed on the upper surface of the substrate 401.

Through the above processes, the atom layer of single-layered structure or multi-layered structure formed of the source gas S and the reaction gas is formed on the upper surface of the substrate 401.

After that, the stage 420 and the guide member 460 are moved in the X-axis direction of FIG. 7, that is, the direction denoted by the arrow M, by using the driving unit 451. After moving the stage 420 and the guide member 460, the space G between the substrate 401 and the guide member 460 may be maintained.

The source gas S and the reaction gas are injected through the third injection opening 433 of the injection unit 430 toward the space G between the substrate 401 and the guide member 460. In more detail, the source gas S is injected through the first penetration portion 461a so as to proceed in the path 461.

The source gas S is adsorbed on an upper surface of the substrate 401, and in particular, a portion corresponding to the space G. After that, an exhaustion process is performed through the exhaust opening 411, and then an atom layer of a single-layered structure or multi-layered structure formed of the source gas S is formed on the upper surface of the substrate 401.

After that, the reaction gas is injected through the fourth injection opening 434 of the injection unit 430 toward the space G that is between the substrate 401 and the guide member 460. In more detail, the reaction gas is injected through the first penetration portion 461a so as to proceed in the path 461.

The reaction gas is adsorbed on the upper surface of the substrate 401, in particular, the portion corresponding to the space G. Then, an exhaustion process is performed through the exhaust opening 411, and then, an atom layer of the single-layered structure or multi-layered structure formed of the reaction gas is formed on the upper surface of the substrate 401.

Through the above processes, the atom layers of single-layered structure or multi-layered structure formed of the source gas S and the reaction gas are additionally formed on the thin film formed by the gases injected through the first and second injection openings 431 and 432 on the upper surface of the substrate 401.

After that, the stage 420 and the guide member 460 are moved in the X-axis direction of FIG. 7, that is, the direction denoted by the arrow M, by using the driving unit 451.

The source gas S and the reaction gas are injected through the fifth and sixth injection openings 435 and 436 of the injection unit 430 toward the space G between the substrate 401 and the guide member 460 so as to form an additional thin film on the substrate 401 like the thin film formed by using the first and second injection openings 431 and 432.

Through the above processes, the thin film of desired thickness may be easily formed on the substrate 401 in one chamber 410. That is, the moving distance of the stage 420 and the guide member 460 may be controlled according to the desired thickness of the thin film.

According to the present embodiment, the gas is injected from the injection unit 430 in a direction parallel with the upper surface of the substrate 401. In particular, the substrate 401 is disposed in a direction perpendicularly to the ground, that is, a direction in which gravity acts. Therefore, when the gas is injected through the injection unit 430 and adsorbed on the substrate 401, an unnecessarily adsorbed amount on the substrate 401 may be reduced. Therefore, after injecting the source gas S through the first injection opening 431 of the injection unit 430, the exhaustion process is performed without performing a purging process using an additional purge gas. After that, the reaction gas is injected through the second injection opening 432, the exhaustion process is performed without performing the purging process using an additional purge gas, and then, the deposition process is finished.

In particular, according to the present embodiment, the guide member 460 is disposed to face the substrate 401 according to the present embodiment. Thus, impurities may be blocked by the guide member 460. In addition, the source gas S injected through the injection unit 430 is not as dispersed, and effectively adsorbed on the substrate 401 between the substrate 401 and the guide member 460, and thereby reducing or improving the thin film deposition efficiency.

In addition, the gas injected from the injection unit 430 passes through the first penetration portion 461a of the path 461 in the guide member 460, and the gas reacts with the substrate 401 in the space G that is connected to the path 461. Then, the gas is exhausted from the guide member 460 through the second penetration portion 461c, and after that, the gas is exhausted through the exhaust opening 411, and thereby preventing the impurities from interfering with the thin film deposition processes.

In addition, the guide member 460 having the space G corresponding to the desired pattern of the thin film is disposed on the substrate 401, and thus, the desired pattern may be easily formed.

Consequently, efficiency of the thin film deposition process for forming the thin film of desired patterns may be greatly improved. In addition, adsorption of the unnecessary gas components may be reduced or prevented, and mixture of purge gas impurities into the thin films formed on the substrate 401 may be reduced or prevented. Therefore, the thin films may be evenly formed, and have excellent physical and chemical characteristics.

In addition, according to the present embodiment, the deposition processes are sequentially performed while moving the stage 420 and the guide member 460 by using the driving unit 451. Therefore, time that is taken for forming the thin film of desired thickness may be greatly reduced and the convenience of deposition processes is improved.

Figure 10:
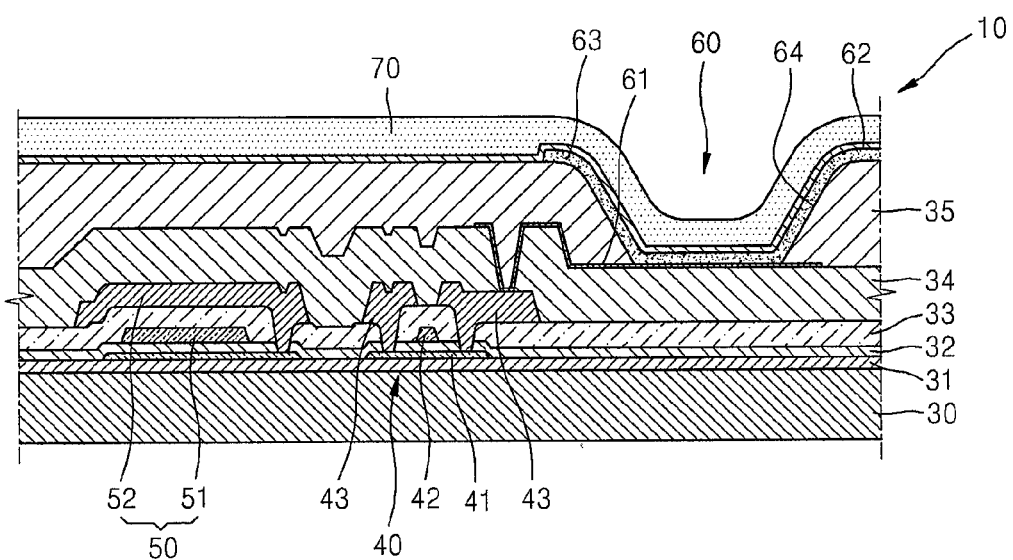
FIG. 10 is a schematic cross-sectional view of an organic light emitting display apparatus manufactured by an organic light emitting display apparatus manufacturing method according to an embodiment of the present invention.

FIG. 10 is a schematic cross-sectional view of an organic light emitting display apparatus 10 manufactured by an organic light emitting display apparatus manufacturing method according to an embodiment of the present invention. In more detail, the organic light emitting display apparatus 10 of FIG. 10 is manufactured by using the vapor deposition apparatus 100, 200, 300, or 400 according to an embodiment of the present invention.

Referring to FIG. 10, the organic light emitting display apparatus 10 is formed on a substrate 30. The substrate 30 may be formed of a glass material, a plastic material, or a metal material. A buffer layer 31 that forms a flat surface on an upper portion of the substrate 30 and includes an insulating material for preventing moisture and impurities from infiltrating into the substrate 30 is formed on the substrate 30.

A thin film transistor (TFT) 40, a capacitor 50, and an organic light emitting device 60 are formed on the buffer layer 31. The TFT 40 includes an active layer 41, a gate electrode 42, and source/drain electrodes 43. The organic light emitting device 60 includes a first electrode 61, a second electrode 62, and an intermediate layer 63.

In more detail, the active layer 41 having a suitable pattern (e.g., a predetermined pattern) is formed on the buffer layer 31. The active layer 41 may be a p-type or an n-type semiconductor. A gate insulating layer 32 is formed on the active layer 41. The gate electrode 42 is formed on the gate insulating layer 32 to correspond to the active layer 41. An interlayer dielectric 33 is formed to cover the gate electrode 42. The source/drain electrodes 43 are formed on the interlayer dielectric 33 so as to contact a suitable region (e.g., a predetermined region) of the active layer 41. A passivation layer 34 is formed to cover the source/drain electrodes 43, and an insulating layer may be additionally formed on the passivation layer 34 for planarizing the passivation layer 34.

The first electrode 61 is formed on the passivation layer 34. The first electrode 61 is electrically connected to the drain electrode 43. In addition, a pixel defining layer 35 is formed to cover the first electrode 61. A set or predetermined opening 64 is formed in the pixel defining layer 35, and the intermediate layer 63 including an organic emission layer is formed on a portion defined by the opening 64. The second electrode 62 is formed on the intermediate layer 63.

An encapsulation layer 70 is formed on the second electrode 62. The encapsulation layer 70 may include an organic or an inorganic material, or may include the organic and inorganic materials stacked alternately.

The encapsulation layer 70 may be formed by using the vapor deposition apparatus 100, 200, 300, or 400. That is, the substrate 30 on which the second electrode 62 is formed is conveyed to the chamber, and the vapor deposition process is performed to form the encapsulation layer 70.

However, the present invention is not limited thereto. That is, other insulating layers of the organic light emitting display apparatus 10 such as the buffer layer 31, the gate insulating layer 32, the interlayer dielectric 33, the passivation layer 34, and the pixel defining layer 35 may be formed by using the vapor deposition apparatus according to embodiments of the present invention.

Also, various conductive thin films such as the active layer 41, the gate electrode 42, the source/drain electrodes 43, the first electrode 61, the intermediate layer 63, and the second electrode 62 may be formed by using the vapor deposition apparatus according to embodiments of the present invention.

According to the vapor deposition apparatus, the vapor deposition method, and the method of manufacturing the organic light emitting display apparatus of embodiments of the present invention, a deposition process may be performed efficiently and characteristics of formed thin films may be improved.

While the present invention has been particularly shown and described with reference to exemplary embodiments thereof, it will be understood by those of ordinary skill in the art that various changes in form and details may be made therein without departing from the spirit and scope of the present invention as defined by the following claims, and their equivalents.

What is claimed is:

1. A vapor deposition method for forming thin films on a substrate, the method comprising:
    mounting the substrate on a mounting surface of a movable stage in a chamber;
    injecting a source gas toward a space between the substrate and a movable guide member disposed in parallel with the substrate through an injection unit in a direction parallel with a surface of the substrate, on which thin films are to be formed;
    performing exhaustion through an exhaust opening of the chamber;
    moving both the stage with the substrate mounted thereon and the guide member;
    injecting a reaction gas into the chamber through the injection unit in a direction parallel with the surface of the substrate; and
    performing an exhaustion through the exhaust opening of the chamber,
    wherein the injection unit injects the reaction gas in a direction parallel in which gravity acts.

2. The method of claim 1, wherein the exhaustion is performed by a pump.

3. The method of claim 1, wherein the injection unit has an injection opening, and the source gas and the reaction gas are sequentially injected through the injection opening.

4. The method of claim 1, wherein the injection unit has a plurality of injection openings, and the source gas and the reaction gas are respectively injected through different ones of injection openings.

5. The method of claim 2, wherein the mounting of the substrate comprises placing a mask having an opening for forming the thin films of desired pattern on the substrate.

6. The method of claim 1, wherein the thin film deposition is performed while concurrently moving both the stage with the substrate mounted thereon and the guide member in a direction perpendicular to the surface of the substrate, on which the thin film is formed.

* * * * *